US009070445B2

(12) United States Patent
Yasuda et al.

(10) Patent No.: US 9,070,445 B2
(45) Date of Patent: Jun. 30, 2015

(54) NONVOLATILE SEMICONDUCTOR MEMORY DEVICE AND METHOD OF OPERATING THE SAME

(71) Applicant: KABUSHIKI KAISHA TOSHIBA, Minato-ku (JP)

(72) Inventors: Naoki Yasuda, Yokkaichi (JP); Yoshiaki Fukuzumi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/151,116

(22) Filed: Jan. 9, 2014

(65) Prior Publication Data

US 2014/0362643 A1     Dec. 11, 2014

(30) Foreign Application Priority Data

Jun. 11, 2013   (JP) .................. 2013-122943

(51) Int. Cl.
*G11C 16/04* (2006.01)
*G11C 16/16* (2006.01)

(52) U.S. Cl.
CPC ............ *G11C 16/0483* (2013.01); *G11C 16/16* (2013.01)

(58) Field of Classification Search
USPC .................................................... 365/185.17
See application file for complete search history.

(56) References Cited

U.S. PATENT DOCUMENTS 6,894,931 B2 *  5/2005  Yaegashi et al. ......... 365/185.22
7,907,463 B2 *  3/2011  Edahiro et al. ............... 365/218
8,130,551 B2 *  3/2012  Oowada et al. .......... 365/185.19
8,446,777 B2 *  5/2013  Ueno et al. ............... 365/185.24
8,767,477 B2 *  7/2014  Ueno et al. ............... 365/185.24
8,929,149 B2 *  1/2015  Shim ........................ 365/185.22
2008/0225602 A1 *  9/2008  Matsubara et al. ....... 365/185.29
2008/0253194 A1 * 10/2008  Sim ......................... 365/185.19
2011/0127597 A1 *  6/2011  Fukuzumi et al. ............ 257/314
2011/0194353 A1 *  8/2011  Hwang et al. ............ 365/185.19
2011/0228610 A1 *  9/2011  Yamada et al. .......... 365/185.19
2012/0069672 A1 *  3/2012  Shiino et al. ............. 365/185.19
2012/0072648 A1 *  3/2012  Shiino et al. .................. 711/103
2012/0257455 A1 * 10/2012  Oh et al. .................. 365/185.22
2013/0077408 A1 *  3/2013  Ueno ....................... 365/185.22

(Continued)

FOREIGN PATENT DOCUMENTS

JP    2004-23044    1/2004
JP    2005-276428   10/2005

(Continued)

*Primary Examiner* — Hoai V Ho
*Assistant Examiner* — Pablo Huerta
(74) *Attorney, Agent, or Firm* — Oblon, McClelland, Maier & Neustadt, L.L.P.

(57) ABSTRACT

A nonvolatile semiconductor memory device according to an embodiment includes a memory cell array having a plurality of electrically rewritable memory transistors arranged therein; and a control unit configured to govern control that repeats a voltage application operation and a step-up operation, the voltage application operation applying an applied voltage to a selected memory transistor to change a threshold voltage at which the selected memory transistor is conductive, and the step-up operation, in the case where a threshold voltage of the selected memory transistor has not changed to a desired value, raising the applied voltage by an amount of a certain step-up value. The control unit is configured to control the step-up operation to monotonically decrease the step-up value as the number of times of the voltage application operations increases.

4 Claims, 14 Drawing Sheets

(56) References Cited

U.S. PATENT DOCUMENTS

2013/0229873 A1* 9/2013 Ueno et al. ............... 365/185.17
2014/0043914 A1* 2/2014 Shim ........................ 365/185.22

FOREIGN PATENT DOCUMENTS

| JP | 2011-198419 | 10/2011 |
| JP | 2012-69186  | 4/2012  |

* cited by examiner

----→ Current During Charging

⟶ Current During "0" Data Write

US 9,070,445 B2

NONVOLATILE SEMICONDUCTOR MEMORY DEVICE AND METHOD OF OPERATING THE SAME

CROSS REFERENCE TO RELATED APPLICATION

This application is based upon and claims the benefit of priority from Japanese Patent Application No. 2013-122943, filed on Jun. 11, 2013, the entire contents of which are incorporated herein by reference.

BACKGROUND

1. Field

The present embodiments relate to a nonvolatile semiconductor memory device and a method of operating the same.

2. Description of the Related Art

In order to increase a degree of integration of memory cells, several nonvolatile semiconductor memory devices having the memory cells disposed three-dimensionally (stacked type nonvolatile semiconductor memory devices) have been proposed in recent years. In these nonvolatile semiconductor memory devices, it is required that deterioration of the memory cells can be suppressed, even when a data write operation and a data erase operation are repeated.

DETAILED DESCRIPTION

A nonvolatile semiconductor memory device according to an embodiment comprises: a memory cell array having a plurality of electrically rewritable memory transistors arranged therein; and a control unit configured to govern control that repeats a voltage application operation and a step-up operation, the voltage application operation applying an applied voltage to a selected memory transistor to change a threshold voltage at which the selected memory transistor is conductive, and the step-up operation, in the case where a threshold voltage of the selected memory transistor has not changed to a desired value, raising the applied voltage by an amount of a certain step-up value. The control unit is configured to control the step-up operation to monotonically decrease the step-up value as the number of times of the voltage application operations increases.

A semiconductor device according to an embodiment is described below with reference to the drawings.

First Embodiment

Figure 1:
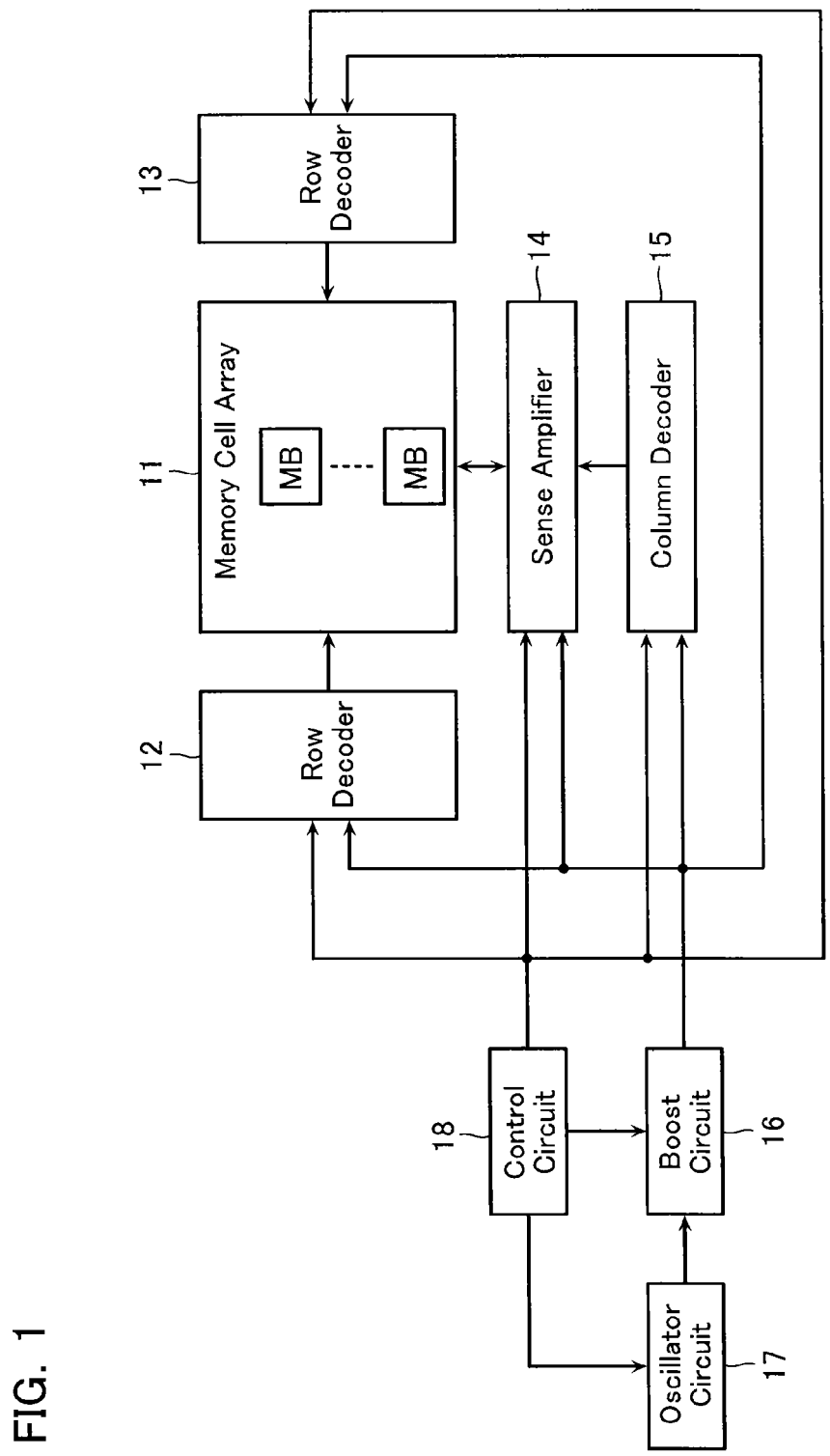
FIG. 1 is a block diagram of a semiconductor device according to a first embodiment.

A configuration of a semiconductor device according to a first embodiment is described below. FIG. 1 is a block diagram of the semiconductor device according to the first embodiment.

As shown in FIG. 1, the semiconductor device according to the first embodiment includes a memory cell array 11, row decoders 12 and 13, a sense amplifier 14, a column decoder 15, a boost circuit 16, an oscillator circuit 17, and a control circuit 18. The present embodiment configures the memory cell array 11 by a stacked structure shown in later-described FIGS. 3 and 4, thereby reducing an occupied area of the memory cell array 11.

The memory cell array 11 is configured from a plurality of memory blocks MB. The memory block MB configures a minimum erase unit of batch erase when executing a data erase operation.

As shown in FIG. 1, the row decoders 12 and 13 function to decode a row address signal and select a word line. The sense amplifier 14 reads data from the memory cell array 11. The column decoder 15 functions to decode a column address signal and select a bit line.

The boost circuit 16 generates a high voltage required during write or erase, and supplies the high voltage to the row decoders 12 and 13, the sense amplifier 14, and the column decoder 15. The oscillator circuit 17 generates a clock signal and supplies that clock signal to the boost circuit 16. The control circuit 18 controls the row decoders 12 and 13, the sense amplifier 14, the column decoder 15, the boost circuit 16, and the oscillator circuit 17.

Figure 2:
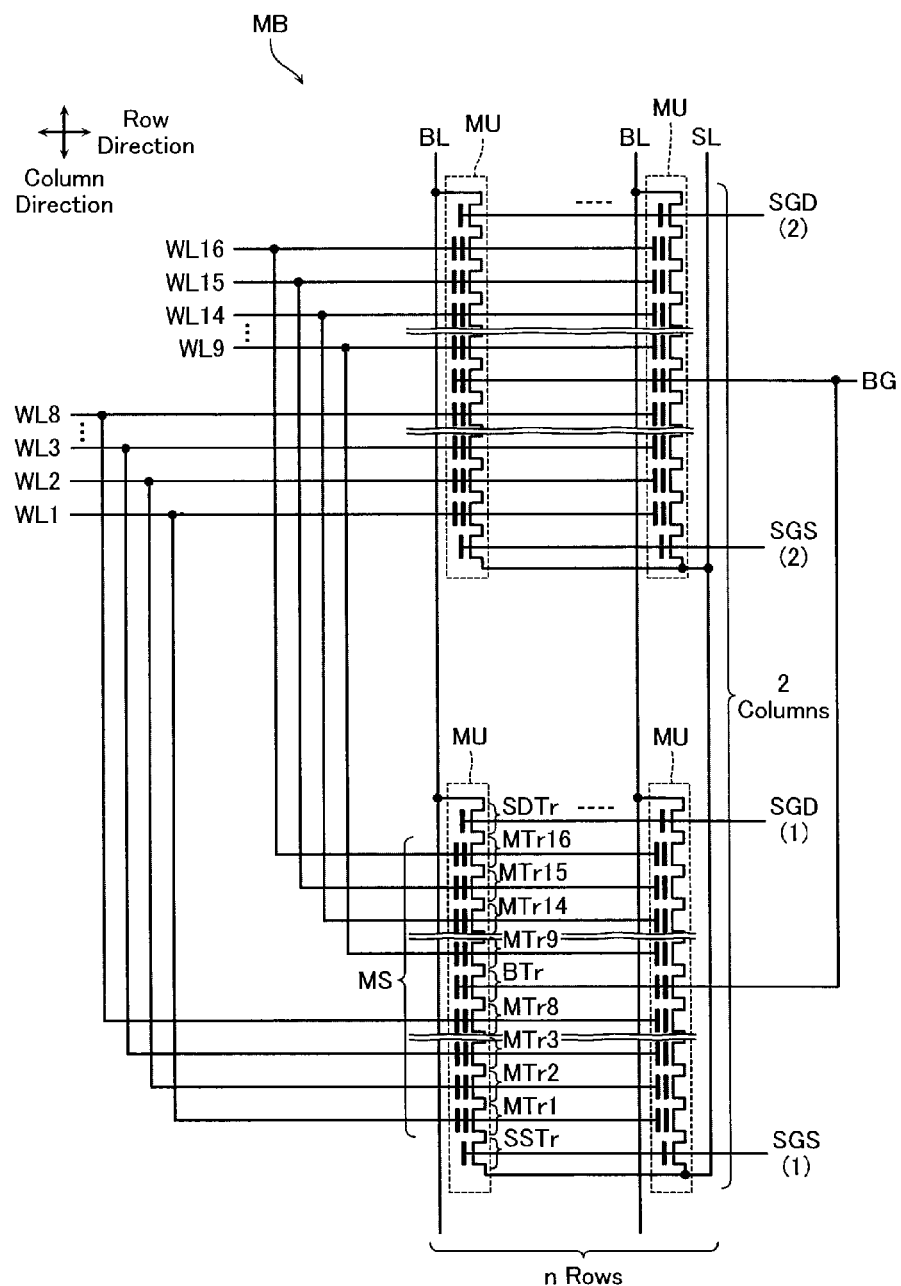
FIG. 2 is a circuit diagram showing a memory block MB according to the first embodiment.

Next, a specific configuration of the memory block MB is described with reference to FIG. 2. As shown in FIG. 2, the memory block MB includes a plurality of bit lines BL, a source line SL, and a plurality of memory units MU connected to these bit lines BL and source line SL.

The memory block MB includes the memory units MU arranged in a matrix of n rows and 2 columns. The configuration of n rows and 2 columns is merely one example, and the memory block MB is not limited to this configuration.

One end of the memory unit MU is connected to the bit line BL, and the other end of the memory unit MU is connected to the source line SL. The plurality of bit lines BL extend in a column direction with a certain pitch in a row direction.

The memory unit MU includes a memory string MS, a source side select transistor SSTr, and a drain side select transistor SDTr.

As shown in FIG. 2, the memory string MS includes memory transistors MTr1~MTr16 (memory cells) and a back gate transistor BTr connected in series. The memory transistors MTr1~MTr8 are connected in series to each other, and the memory transistors MTr9~MTr16 are also connected in series to each other. The back gate transistor BTr is connected between the memory transistor MTr8 and the memory transistor MTr9. Note that as shown in later-described FIG. 3, the memory transistors MTr1~MTr16 are arranged three-dimensionally in the row direction, the column direction, and a stacking direction (perpendicular direction to a substrate). Note that FIG. 2 is merely one example, and the number of memory transistors in the memory string MS is not limited to 16, and may be more than 16 or less than 16.

The memory transistors MTr1~MTr16 hold data by storing a charge in a charge storage film of the memory transistors MTr1~MTr16. The back gate transistor BTr is set to a conductive state at least when the memory string MS is selected as a target of an operation.

Commonly connected to gates of the memory transistors MTr1~MTr16 arranged in the matrix of n rows and 2 columns in the memory block MB are word lines WL1~WL16, respectively. Commonly connected to gates of the n rows and 2 columns of back gate transistors BTr is a single back gate line BG.

A drain of the source side select transistor SSTr is connected to a source of the memory string MS. A source of the source side select transistor SSTr is connected to the source line SL. Commonly connected to gates of the n source side select transistors SSTr arranged in a line in the row direction in the memory block MB is a single source side select gate line SGS(1) or SGS(2). Note that below, the source side select gate lines SGS(1) and SGS(2) are also sometimes collectively referred to as source side select gate line SGS, without distinction.

A source of the drain side select transistor SDTr is connected to a drain of the memory string MS. A drain of the drain side select transistor SDTr is connected to the bit line BL. Commonly connected to gates of the n drain side select transistors SDTr arranged in a line in the row direction in each of the memory blocks MB is a drain side select gate line SGD(1) or SGD(2). Note that below, the drain side select gate lines SGD (1) and SGD(2) are also sometimes collectively referred to as drain side select gate line SGD, without distinction.

Figure 3:
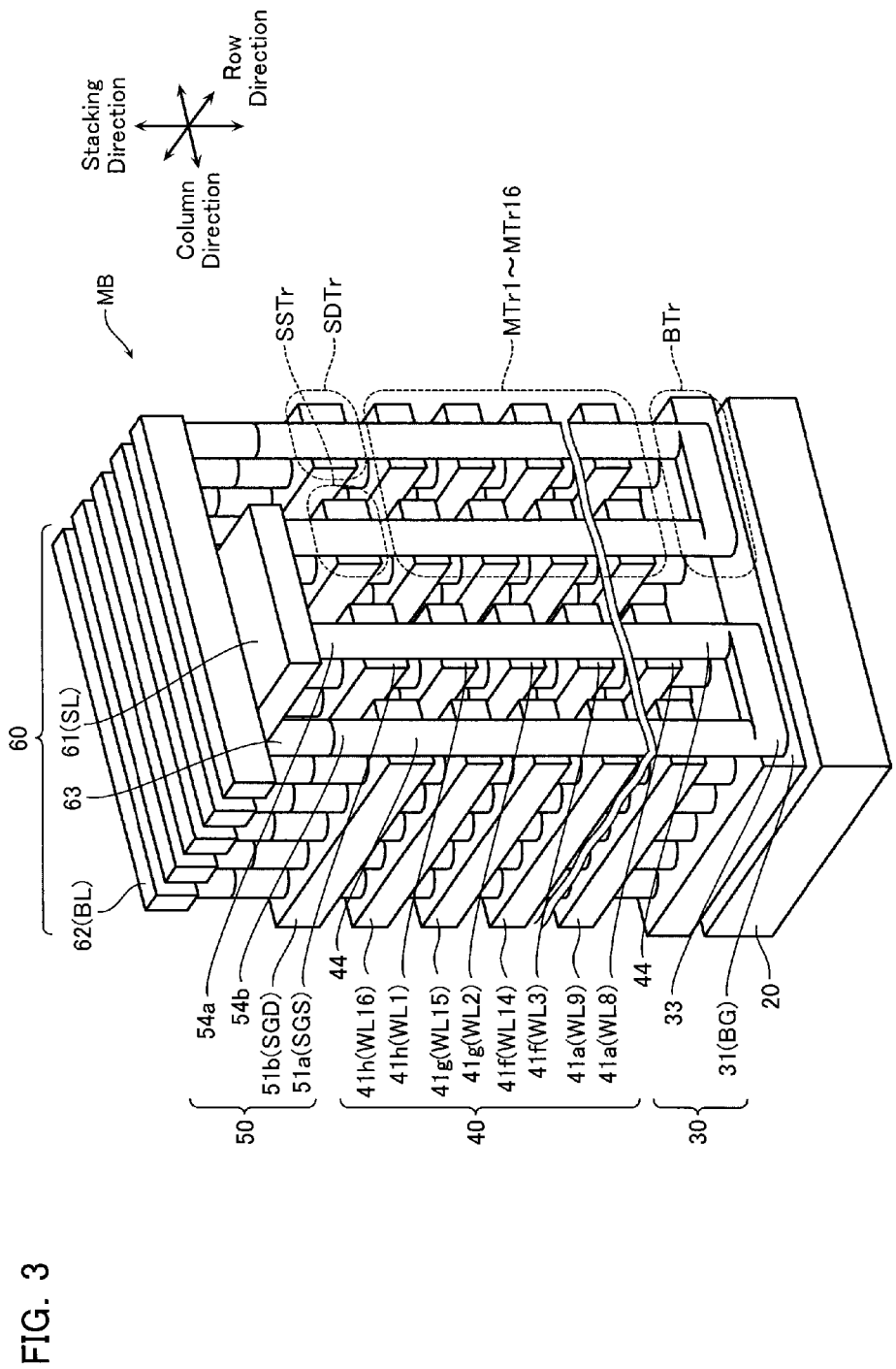
FIG. 3 is a perspective view showing a stacked structure of the memory block MB according to the first embodiment.
Figure 4:
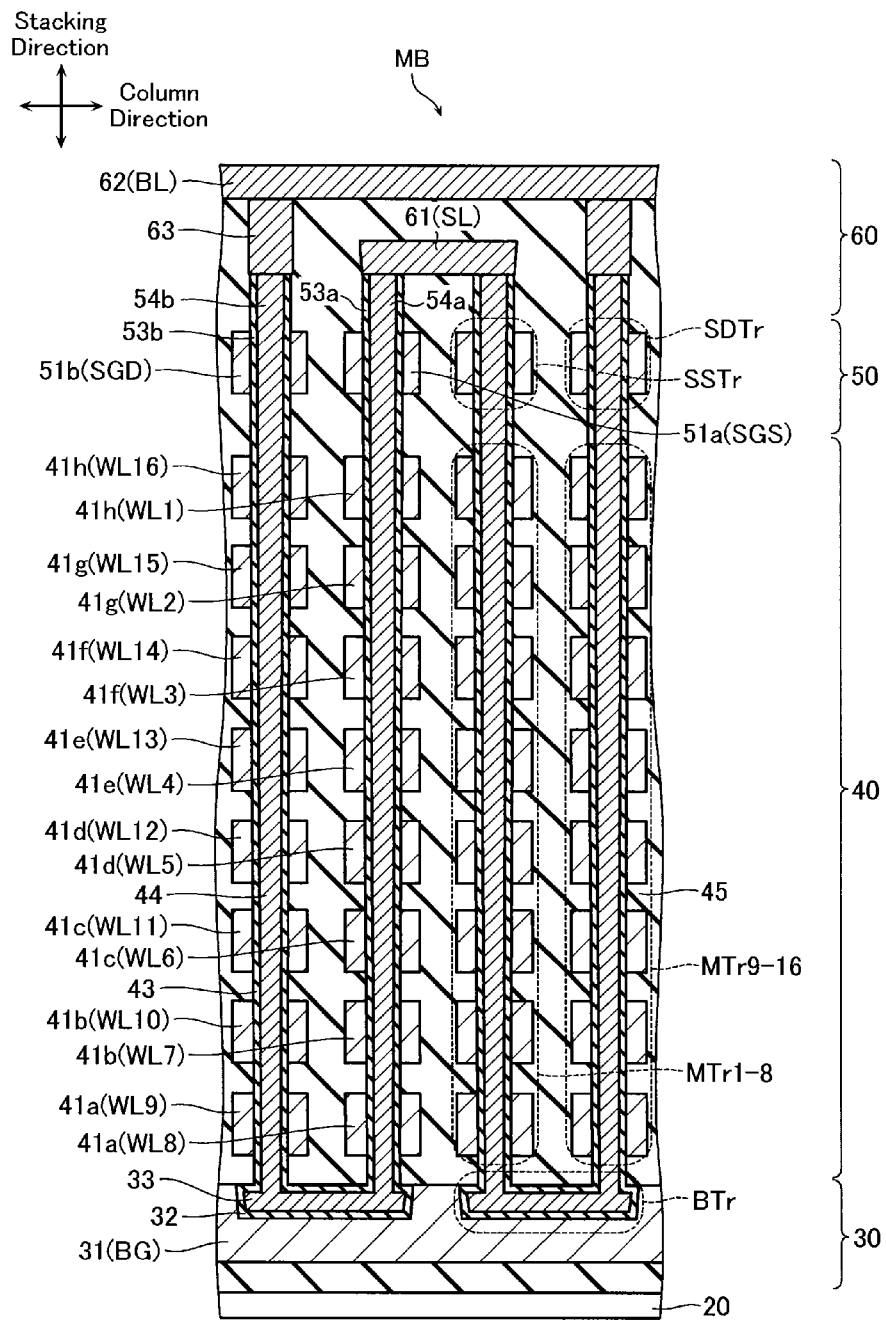
FIG. 4 is a cross-sectional view of the memory block MB according to the first embodiment.

Next, the stacked structure of the memory block MB is described with reference to FIGS. 3 and 4. As shown in FIGS. 3 and 4, the memory block MB includes a back gate layer 30, a memory layer 40, a select transistor layer 50, and a wiring layer 60 that are stacked sequentially on a substrate 20. The back gate layer 30 functions as the back gate transistor BTr. The memory layer 40 functions as the memory transistors MTr1~MTr16. The select transistor layer 50 functions as the drain side select transistor SDTr and the source side select transistor SSTr. The wiring layer 60 functions as the source line SL and the bit line BL.

As shown in FIGS. 3 and 4, the back gate layer 30 includes a back gate conductive layer 31. The back gate conductive layer 31 functions as the back gate line BG and as the gate of the back gate transistor BTr. The back gate conductive layer 31 is formed extending in a plate-like shape two-dimensionally in the row direction and the column direction parallel to the substrate 20. The back gate conductive layer 31 is configured by polysilicon (poly-Si), for example.

As shown in FIGS. 3 and 4, the back gate layer 30 includes a back gate insulating layer 32 and a back gate semiconductor layer 33.

The back gate insulating layer 32 is configured capable of storing a charge. The back gate insulating layer 32 is provided between the back gate semiconductor layer 33 and the back gate conductive layer 31. The back gate insulating layer 32 is configured by a stacked structure of silicon oxide ($SiO_2$), silicon nitride (SiN), and silicon oxide ($SiO_2$), for example.

The back gate semiconductor layer 33 functions as a body (channel) of the back gate transistor BTr. The back gate semiconductor layer 33 is formed digging into the back gate conductive layer 31. The back gate semiconductor layer 33 is configured by polysilicon (poly-Si), for example.

As shown in FIGS. 3 and 4, the memory layer 40 is formed in a layer above the back gate layer 30. The memory layer 40 includes eight layers of word line conductive layers 41a~41h. The word line conductive layer 41a functions as the word line WL8 and as the gate of the memory transistor MTr8. Moreover, the word line conductive layer 41a functions also as the word line WL9 and as the gate of the memory transistor MTr9. Similarly, the word line conductive layers 41b~41h function as the word lines WL7~WL1 and as the gates of the memory transistors MTr7~MTr1, respectively. Moreover, the word line conductive layers 41b~41h function also as the word lines WL10~WL16 and as the gates of the memory transistors MTr10~MTr16, respectively.

The word line conductive layers 41a~41h are stacked sandwiching an interlayer insulating layer 45 between each of the word line conductive layers 41a~41h, above and below. The word line conductive layers 41a~41h extend having the row direction (direction perpendicular to a plane of paper in FIG. 4) as a long direction. The word line conductive layers 41a~41h are configured by polysilicon (poly-Si), for example.

As shown in FIGS. 3 and 4, the memory layer 40 includes a memory gate insulating layer 43 and a memory columnar semiconductor layer 44.

The memory gate insulating layer 43 is configured capable of storing a charge. The memory gate insulating layer 43 is provided between the memory columnar semiconductor layer 44 and the word line conductive layers 41a~41h. The memory gate insulating layer 43 includes a stacked structure of silicon oxide ($SiO_2$), silicon nitride (SiN), and silicon oxide ($SiO_2$), for example. In the semiconductor memory device of the present embodiment, an ONO (Oxide-Nitride-Oxide) layer is provided around the memory columnar semiconductor layer 44 to configure a MONOS type memory cell.

The memory columnar semiconductor layer 44 functions as bodies (channels) of the memory transistors MTr1~MTr16. The memory columnar semiconductor layer 44 extends in the perpendicular direction to the substrate 20, penetrating the word line conductive layers 41a~41h and the interlayer insulating layer 45. A pair of the memory columnar semiconductor layers 44 are formed to align with a close vicinity of the ends extending in the column direction of one back gate semiconductor layer 33. The memory columnar semiconductor layer 44 is configured by polysilicon (poly-Si), for example.

In the above-described back gate layer 30 and memory layer 40, the pair of memory columnar semiconductor layers 44 and the back gate semiconductor layer 33 joining lower ends of the pair of memory columnar semiconductor layers 44 function as a body (channel) of the memory string MS, and are formed in a U shape as viewed from the row direction.

Expressing the above-described configuration of the back gate layer 30 in other words, the back gate conductive layer 31 surrounds side surfaces and a lower surface of the back gate semiconductor layer 33 via the back gate insulating layer 32. Moreover, expressing the above-described configuration of the memory layer 40 in other words, the word line conductive layers 41a~41h surround a side surface of the memory columnar semiconductor layer 44 via the memory gate insulating layer 43.

As shown in FIGS. 3 and 4, the select transistor layer 50 includes a source side conductive layer 51a and a drain side conductive layer 51b. The source side conductive layer 51a functions as the source side select gate line SGS and as the gate of the source side select transistor SSTr. The drain side conductive layer 51b functions as the drain side select gate line SGD and as the gate of the drain side select transistor SDTr.

The source side conductive layer 51a is formed in a layer above one of a pair of the memory columnar semiconductor layers 44. The drain side conductive layer 51b is in the same layer as the source side conductive layer 51a and formed in a layer above the other of a pair of the memory columnar semiconductor layers 44. A plurality of the source side conductive layers 51a and drain side conductive layers 51b are formed extending in the row direction with a certain pitch in the column direction. The source side conductive layer 51a and the drain side conductive layer 51b are configured by polysilicon (poly-Si), for example.

As shown in FIGS. 3 and 4, the select transistor layer 50 includes a source side gate insulating layer 53a, a source side columnar semiconductor layer 54a, a drain side gate insulating layer 53b, and a drain side columnar semiconductor layer 54b. The source side columnar semiconductor layer 54a functions as a body (channel) of the source side select transistor SSTr. The drain side columnar semiconductor layer 54b functions as a body (channel) of the drain side select transistor SDTr.

The source side gate insulating layer 53a is provided between the source side conductive layer 51a and the source side columnar semiconductor layer 54a. The source side gate insulating layer 53a is configured by silicon oxide ($SiO_2$), for example. The source side columnar semiconductor layer 54a extends in the perpendicular direction to the substrate 20, penetrating the source side conductive layer 51a. The source side columnar semiconductor layer 54a is connected to a side surface of the source side gate insulating layer 53a and to one end of a pair of the memory columnar semiconductor layers 44. The source side columnar semiconductor layer 54a is configured by polysilicon (poly-Si), for example.

The drain side gate insulating layer 53b is provided between the drain side conductive layer 51b and the drain side columnar semiconductor layer 54b. The drain side gate insulating layer 53b is configured by silicon oxide ($SiO_2$), for example. The drain side columnar semiconductor layer 54b extends in the perpendicular direction to the substrate 20, penetrating the drain side conductive layer 51b. The drain side columnar semiconductor layer 54b is connected to a side surface of the drain side gate insulating layer 53b and to the other end of a pair of the memory columnar semiconductor layers 44. The drain side columnar semiconductor layer 54b is configured by polysilicon (poly-Si), for example.

The wiring layer 60 includes a source line layer 61, a bit line layer 62, and a plug layer 63. The source line layer 61 functions as the source line SL, and the bit line layer 62 functions as the bit line BL.

The source line layer 61 extends in the row direction, contacting an upper surface of the source side columnar semiconductor layer 54a. The bit line layer 62 extends in the column direction, contacting an upper surface of the drain side columnar semiconductor layer 54b via the plug layer 63. The source line layer 61, the bit line layer 62, and the plug layer 63 are configured by a metal such as tungsten, for example.

[Structure of MONOS Type Memory Cell]

Figure 5:
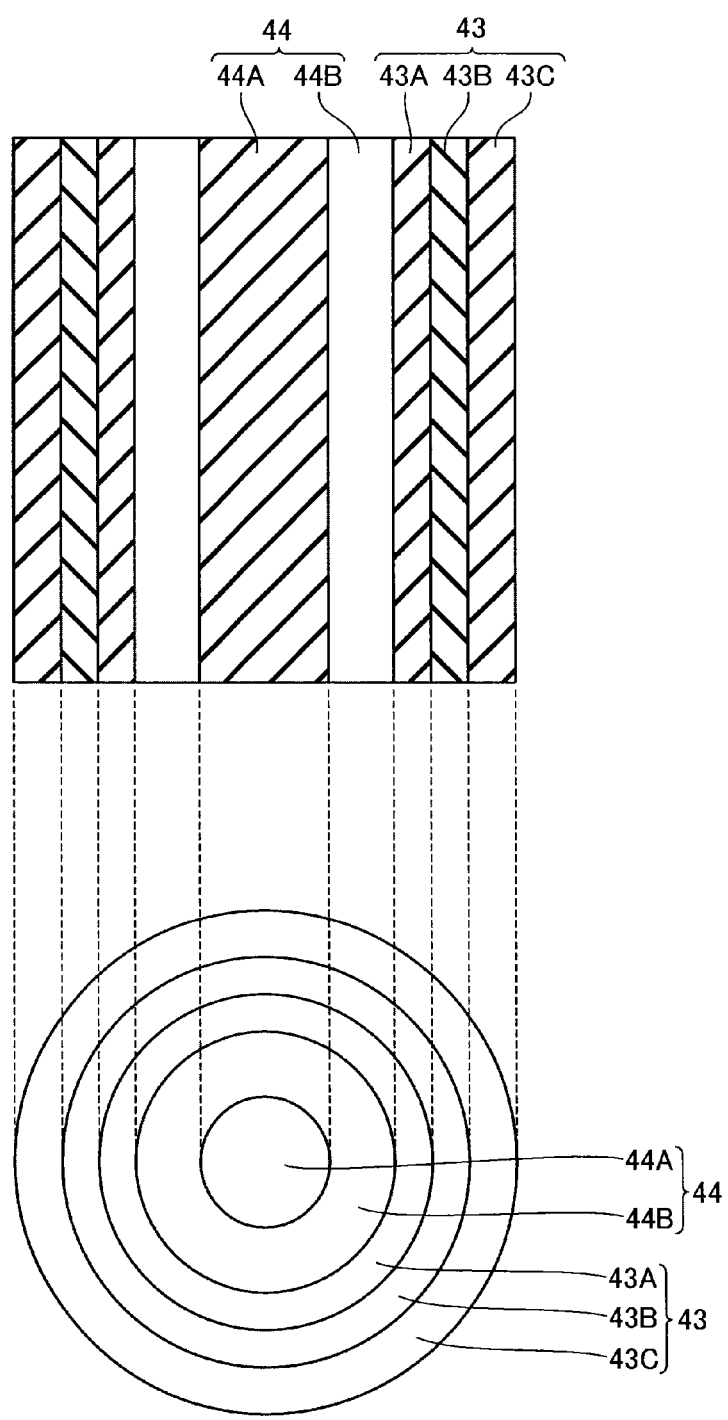
FIG. 5 is a cross-sectional view and a top view showing a MONOS type memory cell according to the first embodiment.

Next, the memory transistor MTr (memory cell) in the nonvolatile semiconductor memory device according to the first embodiment is described using FIG. 5. The detailed stacked structure of the memory gate insulating layer 43 provided to the memory layer 40 is described below.

FIG. 5 is a cross-sectional view and a top view showing a MONOS type memory cell according to the first embodiment. More specifically, the upper portion of FIG. 5 shows a cross-sectional view of the MONOS type memory cell according to the first embodiment, and the lower portion of FIG. 5 shows a planar view of same MONOS type memory cell. Note that FIG. 5 is a view representing the MONOS type memory cell schematically, and that actual dimensions are sometimes different from a state indicated in FIG. 5. FIG. 5 shows a state of the memory gate insulating layer 43 and the memory columnar semiconductor layer 44, and omits the word line conductive layer 41 functioning as the gate.

As shown in FIG. 5, the MONOS type memory cell comprises the memory columnar semiconductor layer 44 and the memory gate insulating layer 43 formed in a cylindrical shape. The memory columnar semiconductor layer 44 includes a core layer 44A formed by for example silicon oxide ($SiO_2$), and a channel semiconductor layer 44B formed by for example silicon (Si) and functioning as a body (channel) of the memory transistor MTr.

The memory gate insulating layer 43 comprises a tunnel insulating film 43A, a charge storage film 43B, and a block insulating film 43C.

The tunnel insulating film 43A is formed surrounding a side surface of the channel semiconductor layer 44B. The tunnel insulating film 43A is configured by silicon oxide ($SiO_2$), for example. The tunnel insulating film 43A, as well as being a single layer film of silicon oxide ($SiO_2$), may also be a stacked film (for example, an ONO tunnel film).

The charge storage film 43B is formed surrounding a side surface of the tunnel insulating film 43A. The charge storage film 43B is configured by silicon nitride (SiN), for example. Moreover, the charge storage film 43B is not limited to silicon nitride (SiN), and may be configured by various kinds of insulating films capable of storing a charge.

The block insulating film 43C is formed surrounding a side surface of the charge storage film 43B. Although omitted from FIG. 5, formed on a side surface of the block insulating film 43C is the word line conductive layer 41 that functions as the gate of the memory cell. The block insulating film 43C is configured by silicon oxide ($SiO_2$), for example. Moreover, the block insulating film 43C is not limited to this, and may be configured by a stacked film of silicon oxide ($SiO_2$) or silicon nitride (SiN).

These memory gate insulating layer 43 and memory columnar semiconductor layer 44 are formed along a cylindrical memory hole, hence are each formed in a cylindrical shape. In addition, the memory gate insulating layer 43 and the memory columnar semiconductor layer 44 are formed concentrically in the memory hole.

[Write Operation]

Next, a write operation of the nonvolatile semiconductor memory device according to the first embodiment is described with reference to FIGS. 6A and 6B.

Figure 6A:
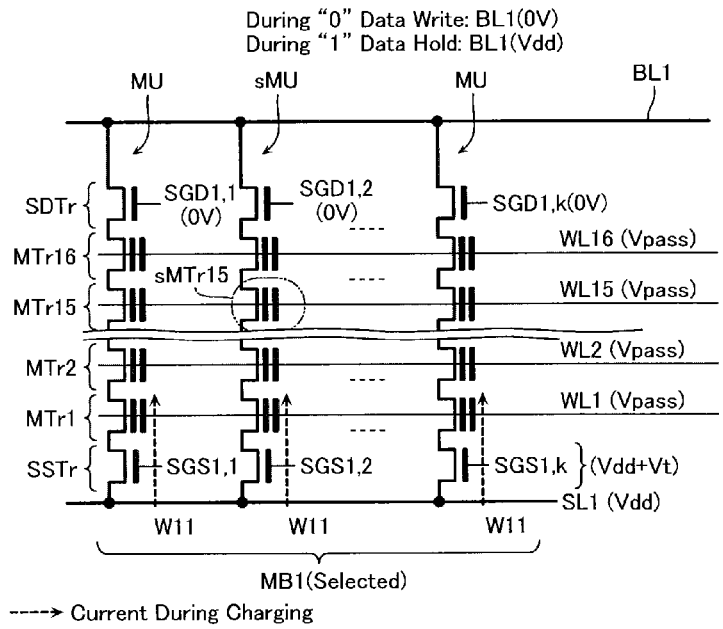
FIG. 6A is a view showing an operation of the memory block MB according to the first embodiment.
Figure 6B:
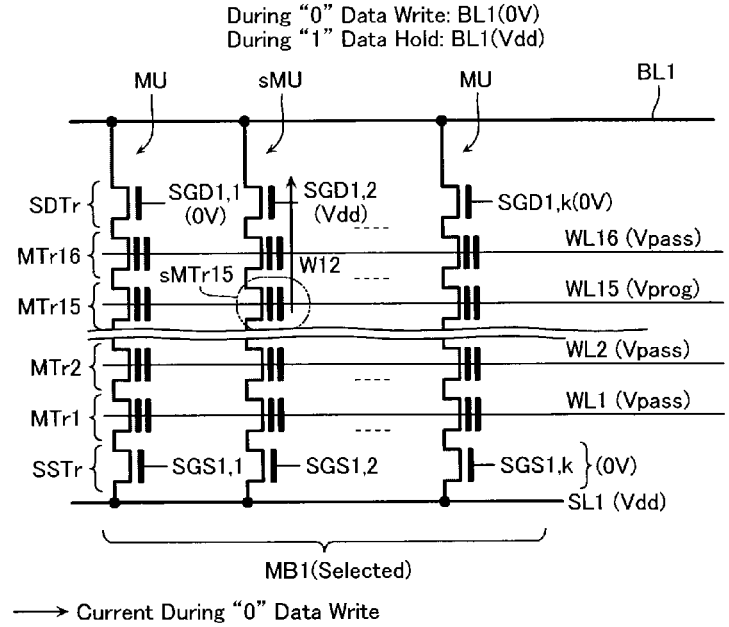
FIG. 6B is a view showing an operation of the memory block MB according to the first embodiment.

FIGS. 6A and 6B show a memory block MB1 which is a part of the memory block MB shown in FIGS. 2~4. In FIGS. 6A and 6B, the memory block MB1 is illustrated omitting a portion of the memory transistors MTr and the back gate transistor BTr in the memory string MS.

Described in FIGS. 6A and 6B as an example is the case where a cell unit MU (referred to below as "selected cell unit sMU) in the memory block MB1 is assumed to be a write target. Description proceeds assuming that write is performed on the memory transistor MTr15 (referred to below as "selected memory transistor sMTr15) in the selected cell unit sMU.

Specifically, as shown in FIG. 6A, first, when writing data of the selected memory transistor sMTr15 with "0" data, a voltage of the bit line BL1 is set to 0 V, and, when holding data of the selected memory transistor sMTr15 at "1" data, the voltage of the bit line BL1 is set to a power supply voltage Vdd (for example, 1.2 V). The source line SL1 is set to the power supply voltage Vdd.

Then, the memory transistors MTr1~MTr16 included in the memory block MB1 have their gates applied with a pass voltage Vpass (for example, 10 V) to be set to a conductive state. The source side select transistor SSTr has its gate applied with a voltage Vdd+Vt to be set to a conductive state. As a result, a voltage of the bodies of the memory transistors MTr1~MTr16 included in the memory block MB1 is charged to the power supply voltage Vdd via the source line SL1 (refer to symbol "W11"). That is, the voltage of the bodies of the memory transistors MTr1~MTr16 included in the memory block MB1 is set greater than or equal to the voltage Vdd able to be applied to the bit line BL1 during the write operation. Moreover, after a certain time, the source side select transistor SSTr is set again to a non-conductive state.

Next, as shown in FIG. 6B, the drain side select transistor SDTr included in the selected cell unit sMU has its gate supplied with the voltage Vdd. When the bit line BL1 is being supplied with 0 V to write "0" data, the drain side select transistor SDTr attains a conductive state, whereby the voltage of the bodies of the memory transistors MTr1~MTr16 included in the selected cell unit sMU is discharged to the same 0 V as the bit line BL1 (refer to symbol "W12"). On the other hand, when the bit line BL1 is being supplied with the power supply voltage Vdd to hold at "1" data, the drain side select transistor SDTr remains unchanged in a non-conductive state. Therefore, the bodies of the memory transistors MTr1~MTr16 included in the selected cell unit sMU are set to a floating state without being discharged and have their potential held at the power supply voltage Vdd.

The drain side select transistor SDTr included in an unselected cell unit MU has its gate supplied with a voltage 0 V to remain unchanged set in a non-conductive state. Therefore, the bodies of the memory transistors MTr1~MTr16 included in the unselected cell unit MU also have their potential held at the power supply voltage Vdd.

Then, a voltage of the gate of the selected memory transistor sMTr15 is set to a program voltage Vprog (=18 V). As a result, in the case of writing "0" data, the voltage of the body of the selected memory transistor sMTr15 is discharged to 0 V, hence the charge storage layer of the selected memory transistor sMTr15 is applied with a high voltage, whereby the write operation on the selected memory transistor sMTr15 is executed. On the other hand, in the case of holding at "1" data, the body of the selected memory transistor sMTr15 is set to a floating state, hence its potential rises by coupling from the power supply voltage Vdd. As a result, the charge storage layer of the selected memory transistor sMTr15 is not applied with a high voltage, and the write operation on the selected memory transistor sMTr15 is not executed.

Now, the gates of the memory transistors MTr1~MTr16 along a plurality of the memory units MU are commonly connected by the word lines WL1~WL16. If the voltage of the gate of the selected memory transistor sMTr15 is assumed to be the program voltage Vprog, then the gate of the memory transistor MTr15 included in a memory unit MU set unselected is also applied with the program voltage Vprog. However, the voltage of the bodies of the memory transistors MTr1~MTr16 included in the unselected memory unit MU is set to a floating state due to the drain side select transistor SDTr and the source side select transistor SSTr that are set to a non-conductive state. Accordingly, the charge storage layer of the memory transistor MTr15 included in the unselected memory unit MU is not applied with a high voltage, and the write operation is not executed.

Then, after applying the write pulse voltage Vprog in this write operation, a verify read (write verify) operation for confirming that a threshold voltage of the selected memory transistor sMTr15 has attained a desired value is performed. If the selected memory transistor sMTr15 is not written to a data "0" state, then the write operation is re-performed on the selected memory transistor sMTr15.

[Step-Up Operation]

Figure 7:
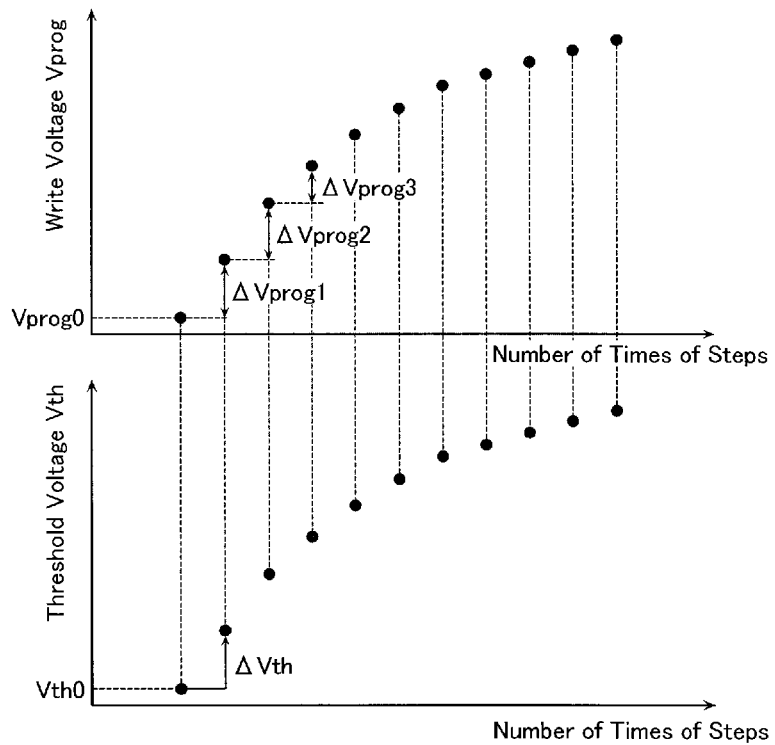
FIG. 7 is a graph showing characteristics during an operation of the MONOS type memory cell according to the first embodiment.

FIG. 7 is a view showing how the write pulse voltage Vprog is stepped up when the write operation is re-performed after the write verify operation. Now, a dotted portion on the graph indicates application of the write pulse voltage Vprog, and the write verify operation is executed between the dotted portions. The upper portion of FIG. 7 shows a graph indicating a voltage of the write pulse voltage Vprog during the write operation, and the lower portion of FIG. 7 shows a graph indicating change in a threshold voltage Vth of the selected memory transistor sMTr during the write operation. The horizontal axis of FIG. 7 indicates the number of times of pulse applications during the write operation.

As shown in FIG. 7, in the semiconductor memory device of the present embodiment, a step-up value ΔVprog of the write pulse voltage Vprog is changed. When the write operation is re-performed after the write verify operation, the write pulse voltage Vprog is set to a voltage (Vprog0+ΔVprog1) which is larger than an initial value Vprog0 by an amount of a step-up value ΔVprog1 (>0) (refer to FIG. 7). In the case there is an insufficiently-written memory transistor MTr even after application of this large write pulse voltage Vprog=Vprog0+ΔVprog1 after re-setting, a step-up operation further increasing the write pulse voltage by an amount of a step-up value ΔVprog2 is performed (Vprog is set such that Vprog=Vprog0+ΔVprog1+ΔVprog2). Thereafter, the write operation, the write verify operation, and the step-up operation are repeated until data write is completed. The larger the number of times of repetitions, the more the write pulse voltage Vprog increases. Control of this step-up value ΔVprog is described in the embodiments below.

[Control of Step-Up Value of Write Pulse Voltage]

Figure 8:
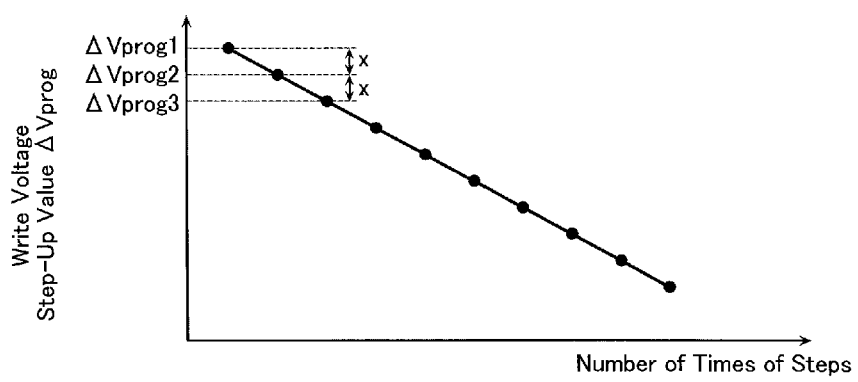
FIG. 8 is a graph showing characteristics during an operation of the MONOS type memory cell according to the first embodiment.

FIG. 8 is a view showing a value of the step-up value ΔVprog of the write pulse voltage Vprog. As mentioned above, the write pulse voltage Vprog steps up in increments of a voltage ΔVprog according to a result of the write verify operation. Now, the value of the step-up value ΔVprog of the write pulse voltage Vprog can be controlled as follows.

As mentioned above, first the write pulse voltage Vprog is set to the voltage Vprog0 and the write operation executed. During the next write operation, the step-up value by which the write pulse voltage Vprog is raised is the step-up value ΔVprog1. Furthermore, during the next write operation, the step-up value by which the write pulse voltage Vprog is raised is the step-up value ΔVprog2. Now, a value of the step-up value ΔVprog2 is smaller than a value of the step-up value ΔVprog1. Thereafter, as the write operation is repeated, the write pulse voltage Vprog increases, but the value of the step-up value ΔVprog of the write pulse voltage Vprog becomes smaller each time the write operation is repeated. In other words, the value of the step-up value ΔVprog decreases monotonically every write pulse voltage application (step-up value ΔVprog (n)>step-up value ΔVprog (n+1)).

Note that in the first embodiment shown in FIG. 8, a value by which the step-up value ΔVprog decreases is constant (step-up value ΔVprog (n)-step-up value ΔVprog (n+1)=x=constant). That is, the step-up value ΔVprog decreases linearly.

As shown in FIG. 7, in a semiconductor memory device including a MONOS type memory cell, as the number of times of applications of the write pulse voltage Vprog increases, a rise in the threshold voltage Vth of the selected memory transistor sMTr becomes more gentle. That is, a value of change ΔVth of the threshold voltage Vth becomes smaller. As a result, a difference between the write pulse voltage Vprog and the threshold voltage Vth of the selected memory transistor sMTr increases, but as explained later, this is a factor causing the memory cell to deteriorate. In order to handle this phenomenon, in the present embodiment, the value of the step-up value ΔVprog is controlled such that the difference between the write pulse voltage Vprog and the threshold voltage Vth of the selected memory transistor sMTr is constant. This is control that monotonically decreases the step-up value ΔVprog in every application of the write pulse voltage Vprog such that the threshold voltage change ΔVth of the selected memory transistor sMTr and the step-up value ΔVprog are made equal. According to recent analysis of the inventors, the following finding was obtained, namely that in a MONOS type memory cell, by controlling the decreasing amount of the step-up value ΔVprog to be constant (step-up value ΔVprog(n)-step-up value ΔVprog(n+1)=x=constant), the difference between the write pulse voltage Vprog and the threshold voltage Vth of the selected memory transistor sMTr becomes nearly constant.

A voltage value of the write pulse voltage Vprog or step-up value ΔVprog can be changed by controlling the boost circuit 16 by an instruction from the control circuit 18. For example, changing the number of charge pumps operated in the boost circuit 16 allows the voltage value of the write pulse voltage Vprog or step-up value ΔVprog to be controlled.

[Advantages]

In the nonvolatile semiconductor memory device of the present embodiment, monotonically decreasing the value of the step-up value ΔVprog of the write pulse voltage Vprog allows effects caused by the write operation to be relaxed, whereby deterioration of the selected memory transistor sMTr can be reduced. This advantage is described with reference to FIGS. 9 and 10.

Figure 9:
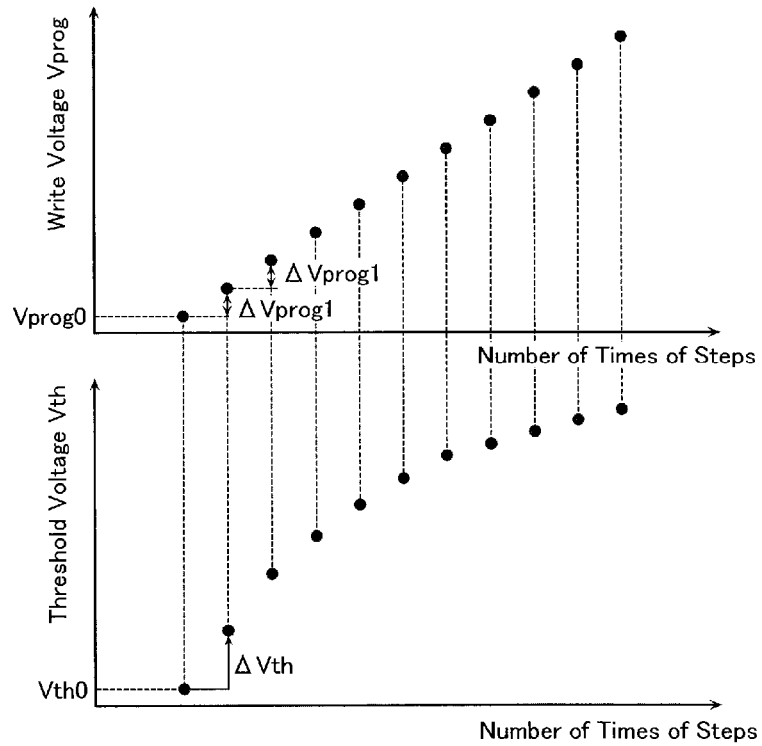
FIG. 9 is a graph showing characteristics during an operation of a MONOS type memory cell according to a comparative example.
Figure 10:
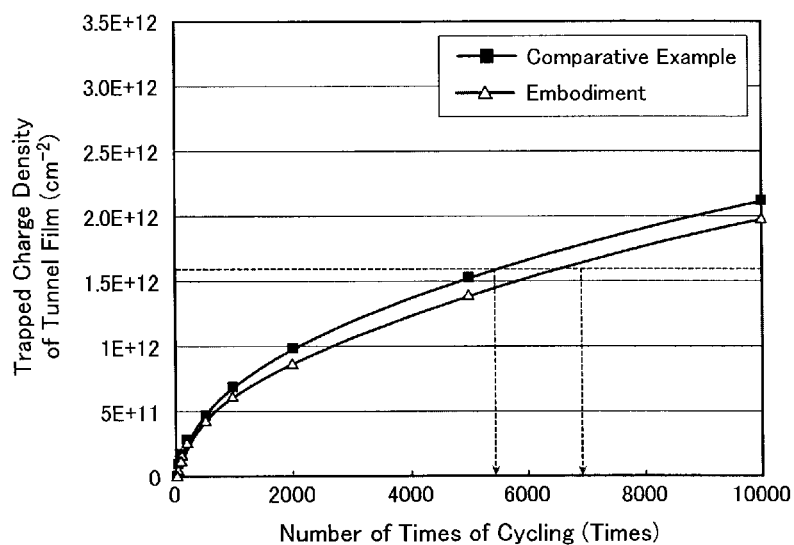
FIG. 10 is a graph showing advantages of an operation of the MONOS type memory cell according to the first embodiment.

FIG. 9 is a graph explaining a step-up operation of a write pulse voltage Vprog in a comparative example. The upper portion of FIG. 9 shows a graph indicating a voltage of the write pulse voltage Vprog during a write operation, and the lower portion of FIG. 9 shows a graph indicating change in a threshold voltage Vth of a selected memory transistor sMTr during the write operation. Moreover, FIG. 10 is a graph for explaining a degree of deterioration of the memory transistor MTr in the cases where the write operation is executed in the embodiment and in the comparative example, respectively.

As shown in FIG. 9, in the write operation of the comparative example, during a time period of the write operation, the step-up value of the write pulse voltage Vprog is set to a constant value ΔVprog1. That is, the write pulse voltage Vprog rises by a constant step-up value ΔVprog1, irrespective of the number of times of applications of the write pulse voltage Vprog.

In the comparative example shown in FIG. 9, on the one hand the rise in the threshold voltage Vth of the selected memory transistor sMTr becomes more gentle, while on the other hand the write pulse voltage Vprog rises by the constant step-up value ΔVprog1. As a result, the difference between the write pulse voltage Vprog and the threshold voltage Vth increases.

Now, the tunnel insulating film 43A of the MONOS type memory cell is applied with an electric field which is proportional to the difference between the write pulse voltage Vprog and the threshold voltage Vth. When the difference between the write pulse voltage Vprog and the threshold voltage Vth increases due to the write operation shown in the comparative example, the electric field applied to the tunnel insulating film 43A increases. There is a risk that this tunnel insulating film 43A greatly deteriorates.

FIG. 10 is a graph showing charge trapping in the tunnel insulating film 43A which is the main cause of deterioration of data retention characteristics. The horizontal axis of FIG. 10 indicates the number of times of cycling that the write/erase operation is repeated, and the vertical axis of FIG. 10 indicates trapped charge density of the tunnel insulating film 43A. The trapped charge density of the tunnel insulating film 43A is a value of the charge remaining in the tunnel insulating film 43A after the write/erase operation. The larger the value of the trapped charge density of the tunnel insulating film 43A, the larger a variation in the threshold voltage Vth during data retention after the write/erase operation. As a result, it becomes more difficult to store data accurately.

In the present embodiment, a reference value of the trapped charge density of the tunnel insulating film 43A, which corresponds to a maximum permitted value of threshold voltage variation during data retention, is set to about $1.6 \times 10^{12}$ cm$^{-2}$. This value allows variation in the threshold voltage Vth to be kept within 0.5 V when the semiconductor memory device is placed in an 85° C. environment for 200 hours. If the trapped charge density of the tunnel insulating film 43A stays below the reference value, the semiconductor memory device operates normally.

As shown in FIG. 10, in the case of adopting the write operation of the comparative example where the write pulse voltage Vprog rises by the constant step-up value ΔVprog1, the semiconductor memory device ceases to operate normally at about 5500 times of cycles of the write/erase operation.

On the other hand, in the case of adopting the write operation of the present embodiment where the value of the step-up value ΔVprog decreases monotonically every application of the write pulse voltage Vprog, reliability can be maintained up to 7000 times of cycles of the write/erase operation.

This is because in the present embodiment, the step-up value ΔVprog decreases monotonically in every application of the write pulse voltage Vprog, whereby the difference between the write pulse voltage Vprog and the threshold voltage Vth becomes constant. As a result, the electric field applied to the tunnel insulating film 43A of the memory transistor MTr is also constant, thereby allowing deterioration of the tunnel insulating film 43A to be suppressed.

Monotonically decreasing the value of the step-up value ΔVprog in every application of the write pulse voltage Vprog in this way enables deterioration of the memory transistor MTr to be reduced, thereby making it possible to improve reliability of the semiconductor memory device.

Second Embodiment

Next, a second embodiment of the present invention is described with reference to FIG. 11. An overall configuration of a semiconductor memory device of the second embodiment is similar to that of the first embodiment, hence a detailed description of the overall configuration is omitted. Moreover, places having a similar configuration to in the first embodiment are assigned with identical symbols to those assigned in the first embodiment, and a duplicated description of those places is omitted. In the above-described first embodiment, the value by which the step-up value ΔVprog decreases was constant. In contrast, the present embodiment differs from the first embodiment in that the value by which the step-up value ΔVprog decreases changes during the course of the write operation.

Figure 11:
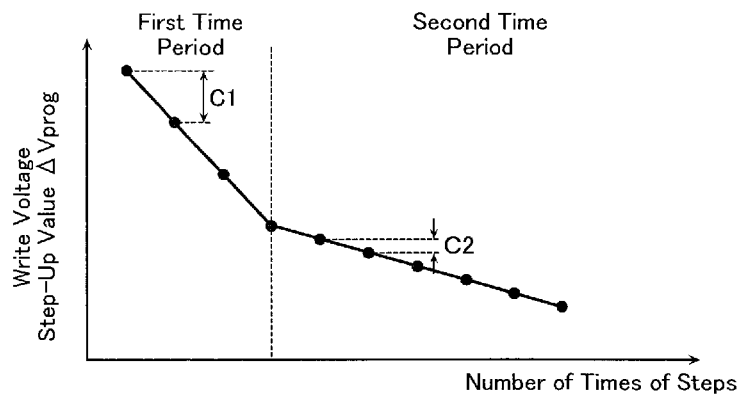
FIG. 11 is a graph showing characteristics during an operation of a MONOS type memory cell according to a second embodiment.

FIG. 11 is a view showing a value of the step-up value ΔVprog of the write pulse voltage Vprog.

Also in the present embodiment, the write pulse voltage Vprog increases each time the write operation is repeated, and the value of the step-up value ΔVprog of the write pulse voltage Vprog becomes smaller as the write operation is repeated. In other words, the step-up value ΔVprog decreases monotonically in every write pulse voltage application (step-up value ΔVprog(n)>step-up value ΔVprog(n+1)).

In the present embodiment, the value by which the step-up value ΔVprog decreases changes during the course of the write operation. For example, in a first time period when the number of times of steps is a certain number or less, step-up value ΔVprog(n)-step-up value ΔVprog(n+1)=C1 (constant), and in a second time period when the number of times of steps is the certain number of times or more, step-up value ΔVprog(n)-step-up value ΔVprog(n+1)=C2 (constant). In the present embodiment shown in FIG. 11, C1>C2.

Figure 12:
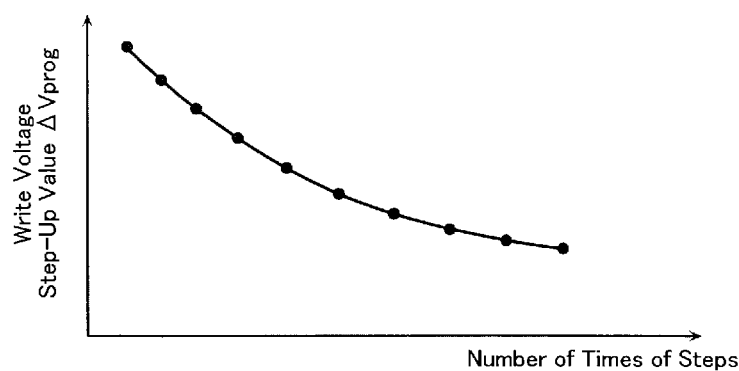
FIG. 12 is a graph showing characteristics during an operation of the MONOS type memory cell according to the second embodiment.

Moreover, the step-up value ΔVprog of the write pulse voltage Vprog only needs to decrease monotonically, and as shown in FIG. 12, a line segment indicating the step-up value ΔVprog may be a curve.

[Advantages]

In the nonvolatile semiconductor memory device of the present embodiment as well, monotonically decreasing the step-up value ΔVprog of the write pulse voltage Vprog relaxes the effects caused by the write operation. As a result, deterioration of the selected memory transistor sMTr can be reduced, thereby making it possible to improve reliability of the semiconductor memory device.

Note that in order to choose optimal parameters (values of x, C1, C2, and so on) when applying control of the write voltage Vprog according to the above-described embodiment to an actual semiconductor memory device, it is required to measure the threshold voltage Vth of the memory transistor MTr during the write operation beforehand. Moreover, it is required to set the parameters employed in control of the write voltage Vprog such that the difference between the write pulse voltage and the threshold voltage of the selected memory transistor sMTr (the value of Vprog-Vth) becomes constant.

By way of supplementary explanation, normally, the value by which the step-up value ΔVprog decreases only needs to be constant, as in the first embodiment. However, sometimes, depending on a film thickness and material of the charge storage layer, such control is insufficient and there is a need for control of the write voltage Vprog as in the present embodiment.

Figure 13A:
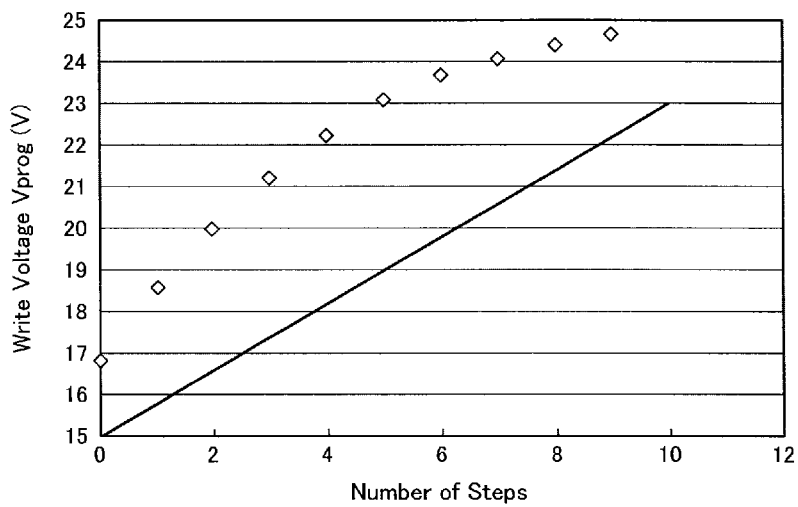
FIG. 13A is a graph explaining setting when executing an operation according to the second embodiment.
Figure 13B:
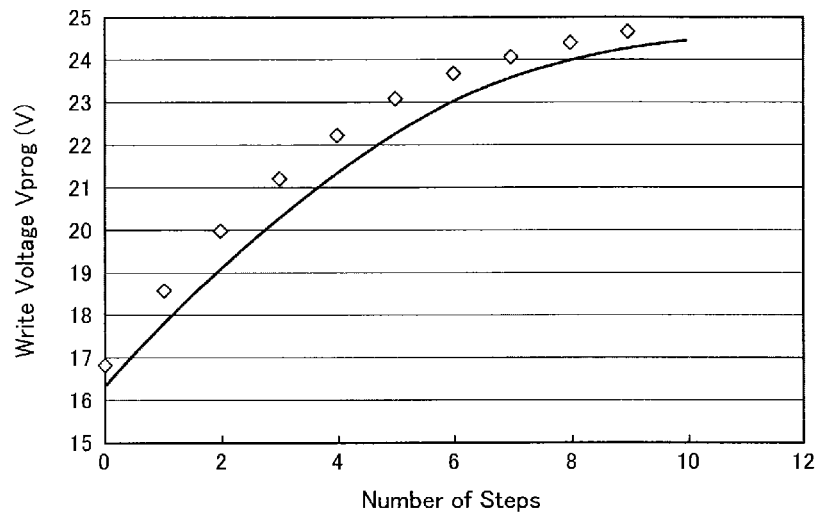
FIG. 13B is a graph explaining setting when executing an operation according to the second embodiment.
Figure 13C:
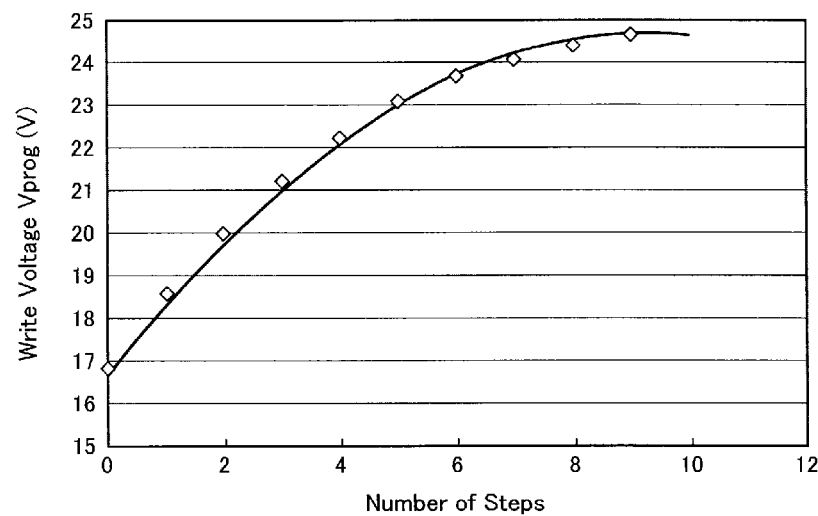
FIG. 13C is a graph explaining setting when executing an operation according to the second embodiment.

FIGS. 13A~13C are graphs explaining optimization of setting parameters when executing the write operation. In FIGS. 13A~13C, a desired value of the write voltage Vprog is shown by a diamond shape, and the write voltage Vprog in the case of using parameters employed in an actual operation is shown by a solid line. In order to apply the above-described control of the write voltage Vprog to an actual semiconductor memory device, measurement of the threshold voltage Vth during the write operation is performed, and a simulation of parameter setting is repeated based on a result of that measurement. Eventually, optimal parameters are set such that the write voltage Vprog in the case of using parameters employed in an actual operation matches the desired value of the write voltage Vprog.

FIGS. 13A~13C show the situation when seeking to optimize the setting parameters by performing measurement of the threshold voltage Vth and changing the setting parameters by a simulation based on the result of that measurement when the number of steps during the write operation is zero times, five times, and nine times, respectively. As shown in FIG. 13C, calculation repeated several times allows parameters employed in an actual operation to be set, thereby enabling control close to the desired value of the write voltage Vprog.

Third Embodiment

Figure 14:
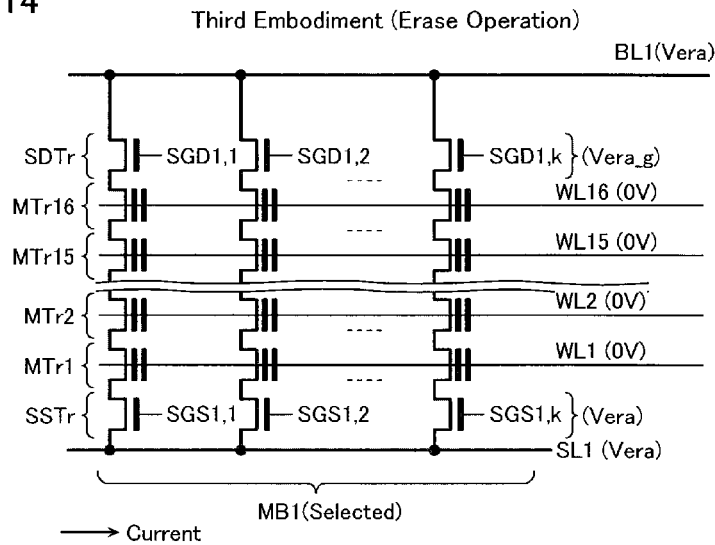
FIG. 14 is a view showing an operation of a memory block MB according to a third embodiment.

Next, a third embodiment of the present invention is described with reference to FIG. 14. An overall configuration of a semiconductor memory device of the third embodiment is similar to that of the first embodiment, hence a detailed description of the overall configuration is omitted. Moreover, places having a similar configuration to in the first embodiment are assigned with identical symbols to those assigned in the first embodiment, and a duplicated description of those places is omitted. The above-mentioned first and second embodiments described a write operation on the memory transistor. In contrast, the present embodiment differs from the first and second embodiments in describing an erase operation on the memory transistor.

The erase operation of the nonvolatile semiconductor memory device according to the third embodiment is described with reference to FIG. 14. FIG. 14 shows the memory block MB1 which is a part of the memory block MB shown in FIGS. 2~4. In FIG. 14, the memory block MB1 is illustrated omitting a portion of the memory transistors MTr and the back gate transistor BTr in the memory string MS. In the example shown in FIG. 14, the memory block MB1 is assumed to be selected as a target of the erase operation.

[Erase Operation]

The erase operation is performed in a batch on all memory transistors MTr of an erase target block. The bit line BL and the source line SL are set to a voltage Vera, and the drain side select gate line SGD is applied with a voltage Vera_g (<Vera), thereby generating GIDL (Gate Induced Drain Leakage) at the drain side select transistor SDTr. This GIDL current supplies holes required in the erase operation. Now, the voltage Vera_g is set as a value of the voltage Vera from which a constant offset voltage is subtracted. On the other hand, the source side select gate line SGS is applied with the voltage Vera, whereby the source side select transistor SSTr is set to a cutoff state. In addition, the word lines WL1~WL16 are applied with 0 V. This causes a high voltage to be applied to a MONOS insulating film of the memory transistors MTr1~MTr16. Therefore, electrons stored in the charge storage film 43B are emitted to the channel semiconductor layer 44B and, moreover, holes are injected into the charge storage film 43B from the channel semiconductor layer 44B. As a result, a threshold voltage distribution of the memory transistor lowers, whereby data is erased.

Then, after applying the erase voltage Vera in this erase operation, a verify read (erase verify) operation for confirming that the threshold voltage Vth of the memory transistor MTr of the erase target block has attained a desired value can be performed. If a certain number of the memory transistors MTr are not erased to a data "1" state, then the erase operation is re-performed on the erase target block.

[Step-Up Operation]

Figure 15:
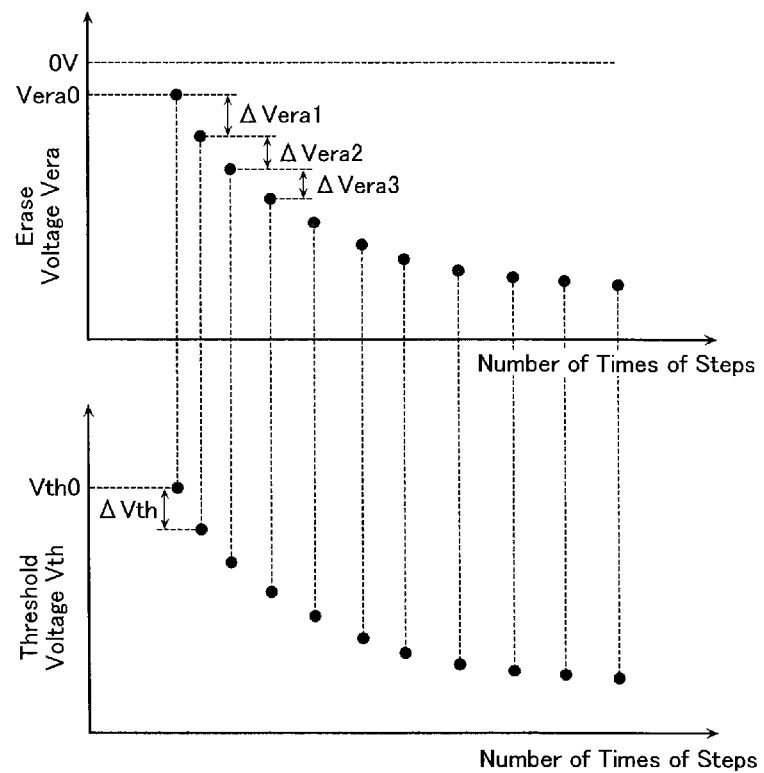
FIG. 15 is a graph showing characteristics during an operation of a MONOS type memory cell according to the third embodiment.

FIG. 15 is a view showing how the erase voltage Vera is stepped up when the erase operation is re-performed after the erase verify operation. Now, the erase operation applies the erase voltage Vera to the body of the memory transistor MTr and is equivalent to a state where the word lines WL1~WL16 (gate electrodes) of the memory transistors MTr are applied with a negative erase voltage Vera. In the graph of FIG. 15, the erase voltage Vera is indicated as a voltage applied to the word lines WL1~WL16 (gate electrodes) with reference to a channel potential of the memory transistor MTr. In this case, a value of the erase voltage Vera increasing in a negative direction expresses a state that the value of the erase voltage Vera applied to the body of the memory transistor MTr in an actual operation is being stepped up. Note that in the description below, Vera is sometimes used with the meaning of its absolute value.

The upper portion of FIG. 15 shows a graph indicating a voltage of the erase voltage Vera during the erase operation, and the lower portion of FIG. 15 shows a graph indicating change in a threshold voltage Vth of the memory transistor MTr during the erase operation. The horizontal axis of FIG. 15 indicates the number of times of pulse applications during the erase operation.

As shown in FIG. 15, in the semiconductor memory device of the present embodiment, a step-up value $\Delta$Vera of the erase voltage Vera is changed. When the erase operation is re-performed after the erase verify operation, the erase voltage Vera (>0) applied to the body of the memory transistor MTr is set to a voltage (Vera0+$\Delta$Vera1) which is larger than an initial value Vera0 by an amount of a step-up value $\Delta$Vera1 (>0) (indicated to be increasing in a negative direction in FIG. 15). In the case there is an insufficiently-erased memory transistor MTr even after application of this large erase voltage Vera=Vera0+$\Delta$Vera1 after re-setting, a step-up operation further increasing the erase voltage by an amount of a step-up value $\Delta$Vera2 is performed (Vera is set such that Vera=Vera0+ $\Delta$Vera1+$\Delta$Vera2). Thereafter, the erase operation, the erase verify operation, and the step-up operation are repeated until data erase is completed. The larger the number of times of repetitions, the more the erase voltage Vera applied to the body of the memory transistor MTr increases. Control of this step-up value $\Delta$Vera is described in the embodiments below.

[Control of Step-Up Value of Erase Voltage]

Figure 16:
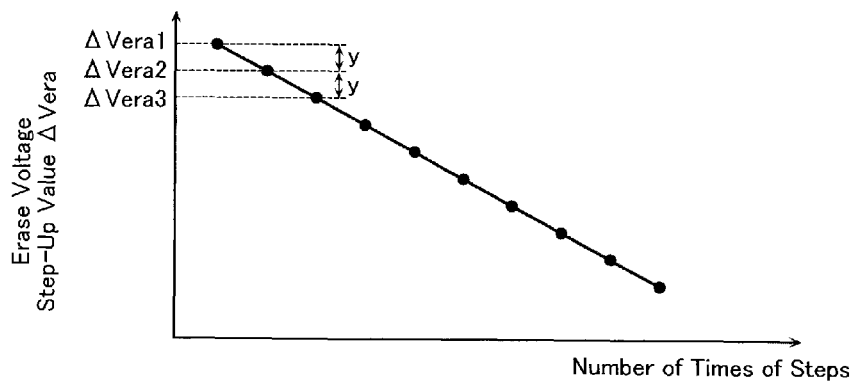
FIG. 16 is a graph showing characteristics during an operation of the MONOS type memory cell according to the third embodiment.

FIG. 16 is a view showing a step-up value $\Delta$Vera of the erase voltage Vera. As mentioned above, the erase voltage Vera steps up in increments of a voltage $\Delta$Vera according to a result of the erase verify operation. Now, the value of the step-up value $\Delta$Vera of the erase voltage Vera can be controlled as follows.

As mentioned above, first the erase voltage Vera is set to the voltage Vera0 and the erase operation is executed. During the next erase operation, the step-up value by which the erase voltage Vera is raised is the step-up value $\Delta$Vera1. Furthermore, during the next erase operation, the step-up value by which the erase voltage Vera is raised is the step-up value $\Delta$Vera2. Now, the step-up value $\Delta$Vera2 is smaller than the step-up value $\Delta$Vera1. Thereafter, the erase voltage Vera increases each time the erase operation is repeated, but the step-up value $\Delta$Vera of the erase voltage Vera becomes smaller as the erase operation is repeated. In other words, the step-up value $\Delta$Vera decreases monotonically in every erase pulse voltage application (step-up value $\Delta$Vera (n)>step-up value $\Delta$Vera(n+1)).

Note that in the third embodiment shown in FIG. 16, a value by which the step-up value $\Delta$Vera decreases is constant (step-up value $\Delta$Vera(n)-step-up value $\Delta$Vera (n+1)=y=constant). That is, the step-up value $\Delta$Vera decreases linearly.

As shown in FIG. 15, in a semiconductor memory device including a MONOS type memory cell, as the number of times of applications of the erase voltage Vera increases, a decrease in the threshold voltage Vth of the selected memory transistor sMTr becomes more gentle. That is, a value of change $\Delta$Vth of the threshold voltage Vth becomes smaller. Now, the increase of a difference between the erase voltage Vera and the threshold voltage Vth of the memory transistor MTr is a factor causing the memory cell to deteriorate. This is because an electric field applied to the tunnel insulating film 43A during the erase operation increases. In order to handle this phenomenon, in the present embodiment, the step-up value $\Delta$Vera is controlled such that the difference between the erase voltage Vera and the threshold voltage Vth of the selected memory transistor sMTr is constant. This is control that monotonically decreases the step-up value $\Delta$Vera in every application of the erase voltage Vera such that the threshold voltage change $\Delta$Vth of the selected memory transistor sMTr and the step-up value $\Delta$Vera are made equal. Using a constant decreasing amount in the step-up value $\Delta$Vera (step-up value $\Delta$Vera(n)-step-up value $\Delta$Vera (n+1)=y=constant) as in the present embodiment represents a good approximation to such control.

[Advantages]

During the erase operation, the tunnel insulating film 43A of the MONOS type memory transistor MTr is applied with an electric field which is proportional to the difference between the erase voltage Vera and the threshold voltage Vth. Moreover, there is a risk that if the difference between the erase voltage Vera and the threshold voltage Vth increases, this tunnel insulating film 43A greatly deteriorates. However, in the case of adopting the erase operation of the present embodiment, the step-up value $\Delta$Vera decreases monotonically in every application of the erase voltage Vera, hence the difference between the erase voltage Vera and the threshold voltage Vth is constant. As a result, the electric field applied to the tunnel insulating film 43A of the memory transistor MTr is constant, thereby allowing deterioration of the tunnel insulating film 43A to be suppressed.

Monotonically decreasing the value of the step-up value $\Delta$Vera in every application of the erase voltage Vera in this way enables deterioration of the memory transistor MTr to be reduced, thereby making it possible to improve reliability of the semiconductor memory device.

Note that in order to choose an optimal parameter (value of y) when applying control of the erase voltage Vera according to the above-described embodiment to an actual semiconductor memory device, it is required to measure the threshold voltage Vth of the memory transistor MTr during the erase operation beforehand. Moreover, it is required to set the parameter employed in control of the erase voltage Vera such that the difference between the erase voltage and the threshold voltage of the selected memory transistor sMTr (the value of Vera-Vth) is a constant value.

Figure 17A:
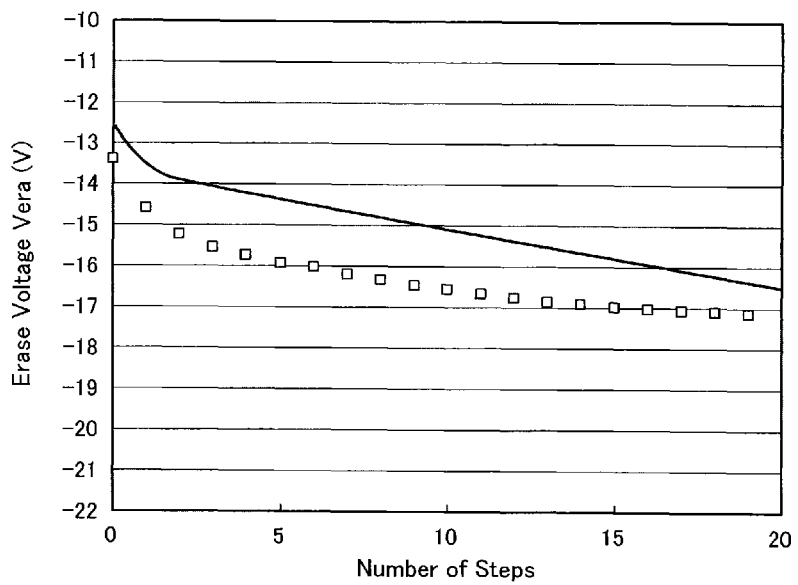
FIG. 17A is a graph explaining setting when executing an operation according to the third embodiment.
Figure 17B:
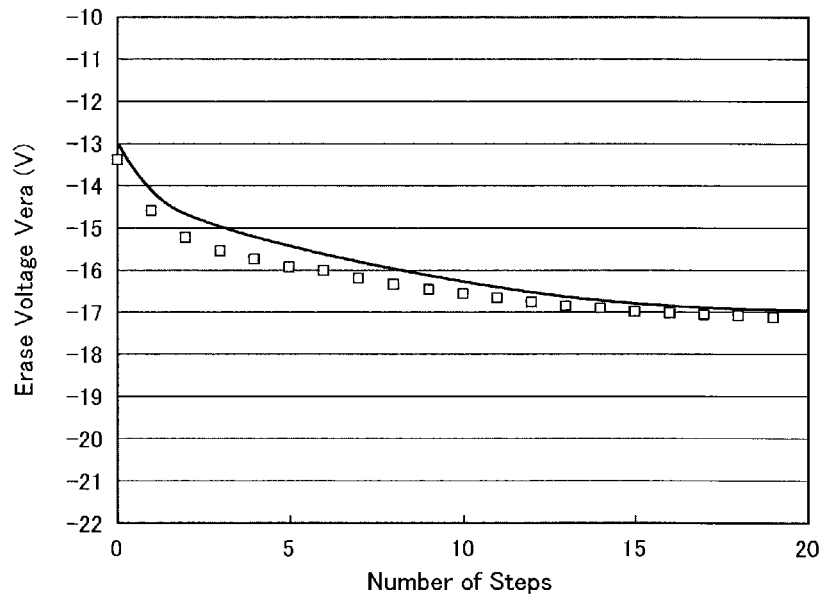
FIG. 17B is a graph explaining setting when executing an operation according to the third embodiment.
Figure 17C:
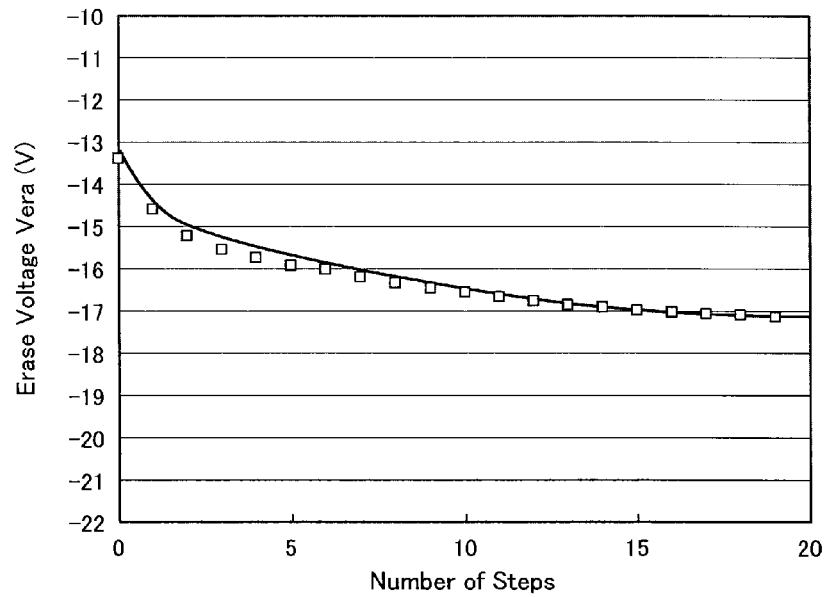
FIG. 17C is a graph explaining setting when executing an operation according to the third embodiment.

FIGS. 17A~17C are graphs explaining optimization of the setting parameter when executing the erase operation. In FIGS. 17A~17C, a desired value of the erase voltage Vera is shown by a square shape, and the erase voltage Vera in the case of using the parameter employed in an actual operation is shown by a solid line. In order to apply the above-described control of the erase voltage Vera to an actual semiconductor memory device, measurement of the threshold voltage Vth during the erase operation is performed, and a simulation of parameter setting is repeated based on a result of that measurement. Eventually, an optimal parameter is set such that the erase voltage Vera in the case of using the parameter employed in an actual operation matches the desired value of the erase voltage Vera.

FIGS. 17A~17C show the situation when seeking to optimize the setting parameter by performing measurement of the threshold voltage Vth and changing the setting parameter by a simulation based on the result of that measurement when the number of steps during the erase operation is zero times, five times, and nine times, respectively. As shown in FIG. 17C, calculation repeated several times allows the parameter employed in an actual operation to be set, thereby enabling control close to the desired value of the erase voltage Vera.

Fourth Embodiment

Figure 18:
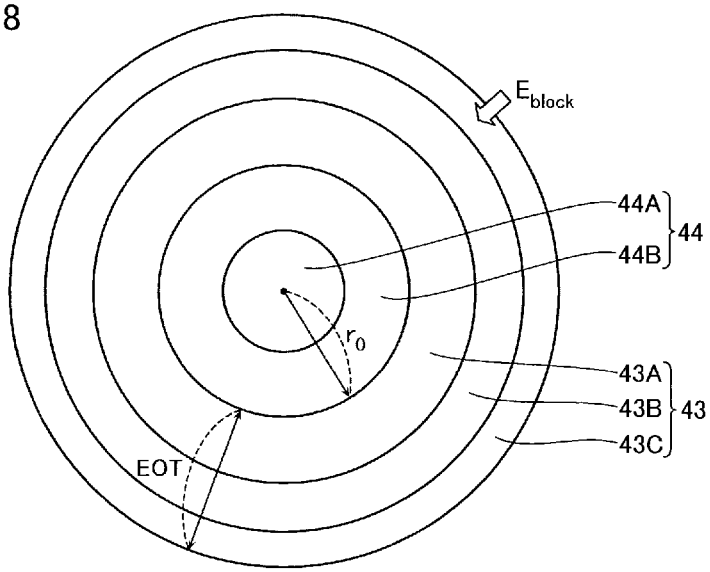
FIG. 18 is a cross-sectional view showing a MONOS type memory cell according to a fourth embodiment.

Next, a fourth embodiment of the present invention is described with reference to FIGS. 18 and 19. An overall configuration of a semiconductor memory device of the fourth embodiment is similar to that of the first embodiment, hence a detailed description of the overall configuration is omitted. Moreover, places having a similar configuration to in the first embodiment are assigned with identical symbols to those assigned in the first embodiment, and a duplicated description of those places is omitted. The above-mentioned third embodiment described an example where the value of the erase voltage Vera applied to the body of the memory transistor MTr is stepped up. In contrast, the present embodiment differs from the third embodiment in having the value of the erase voltage Vera stepped down.

During the erase operation, it is required to consider electrons back-tunneling from the word lines WL1~WL16 (gate electrodes) of the memory transistors MTr, injection of holes from the channel semiconductor layer 44B, in addition to emission of electrons to the channel semiconductor layer 44B from the charge storage film 43B. In particular, electrons back-tunneling from the word lines WL1~WL16 (gate electrodes) cause erase saturation and moreover are a factor in deterioration of reliability of the memory cell due to repeated operation, hence not only the electric field applied to the tunnel insulating film 43A, but also the electric field applied to the block insulating film 43C (electric field Eblock in FIG. 18), must be kept constant.

Now, the electric field applied to the block insulating film 43C is expressed by expression 1 below.

$$Eblock = \frac{|Vera| - |Vth|}{(r0 + EOT)\log\left(1 + \frac{EOT}{r0}\right)} + \frac{|Vth|}{(r0 + EOT)\log\left(1 + \frac{(1-\alpha)EOT}{r0 + \alpha EOT}\right)}$$ [Expression 1]

Note that r0 is a distance from a center of the memory columnar semiconductor layer 44 to a surface of the channel semiconductor layer 44B, EOT is an electrical film thickness of the memory gate insulating layer 43 (Equivalent Oxide Thickness), and $\alpha$ is a parameter indicating a position of trapped charge.

Now, t1 and t2 shown in expression 2 below are dimensional factors due to a shape of the memory hole.

$$t1 = (r0 + EOT)\log\left(1 + \frac{EOT}{r0}\right)$$ [Expression 2]

$$t2 = (r0 + EOT)\log\left(1 + \frac{(1-\alpha)EOT}{r0 + \alpha EOT}\right)$$

In order for these expressions to result in a constant electric field Eblock applied to the block insulating film 43C, expression 3 below must be satisfied.

$$\Delta Vera = -\left(\frac{t1}{t2} - 1\right)\Delta Vth$$ [Expression 3]

From this it is understood that if the absolute value of the erase voltage Vera during the erase operation is lowered by an amount proportional to $\Delta$Vth in the course of the erase operation, the erase operation can be performed while maintaining the electric field applied to the block insulating film 43C constant. That is, stepping down the erase voltage Vera applied to the body of the memory transistor MTr makes it possible to perform an erase operation where the electric field of the block insulating film 43C is maintained constant.

[Step-Down Operation]

Figure 19:
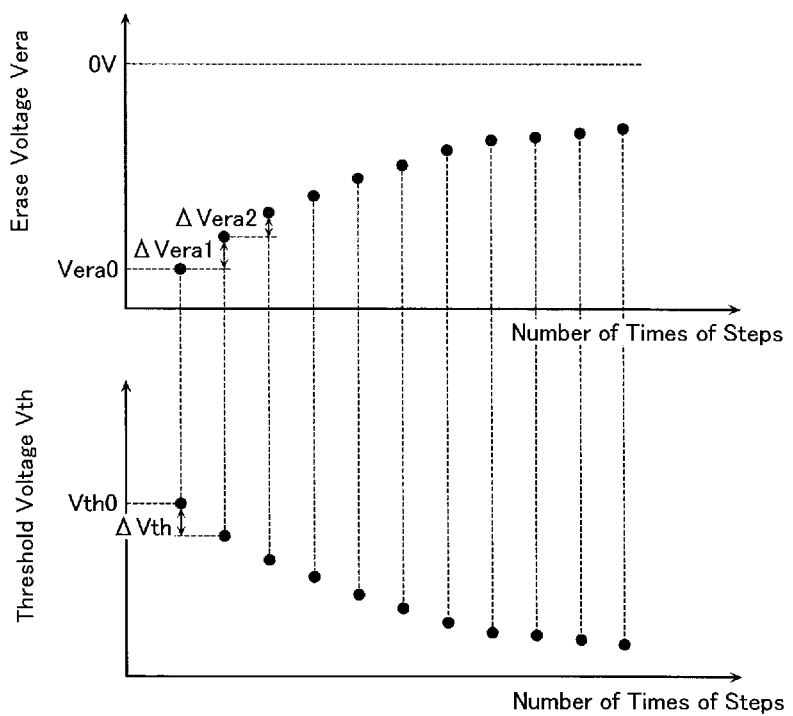
FIG. 19 is a graph showing characteristics during an operation of the MONOS type memory cell according to the fourth embodiment.

FIG. 19 is a view showing how the erase voltage Vera is stepped down. Now, the erase operation applies the erase voltage Vera to the body of the memory transistor MTr and is equivalent to a state where the word lines WL1~WL16 (gate electrodes) of the memory transistors MTr are applied with a negative erase voltage Vera. In the graph of FIG. 19, the erase voltage Vera is indicated as a voltage applied to the word lines WL1~WL16 (gate electrodes) with reference to a channel potential of the memory transistor MTr. In this case, the value of the erase voltage Vera approaching zero expresses a state that the value of the erase voltage Vera applied to the body of the memory transistor MTr in an actual operation is being stepped down. The upper portion of FIG. 19 shows a graph indicating the erase voltage Vera during the erase operation, and the lower portion of FIG. 19 shows a graph indicating change in the threshold voltage Vth of the memory transistor MTr during the erase operation. The horizontal axis of FIG. 19 indicates the number of times of pulse applications during the erase operation.

As shown in FIG. 19, in the semiconductor memory device of the present embodiment, a step-down value $\Delta$Vera of the erase voltage Vera is changed. When the erase operation is re-performed after the erase verify operation, the erase voltage Vera applied to the body of the memory transistor MTr is set to a voltage (Vera0-ΔVera1) which is smaller than an initial value Vera0 by an amount of a step-down value ΔVera1 (>0) (indicated as a negative value becoming smaller in FIG. 19). In the case there is an insufficiently-erased memory transistor MTr even after application of this erase voltage Vera=Vera0-ΔVera1 after re-setting, a step-down operation further decreasing the erase voltage by an amount of a step-down value ΔVera2 is performed (Vera is set such that Vera=Vera0-ΔVera1-ΔVera2). Thereafter, the erase operation, the erase verify operation, and the step-down operation are repeated until data erase is completed. The larger the number of times of repetitions, the more the erase voltage Vera decreases.

This step-down value ΔVera can be controlled similarly to the operation shown using FIG. 16 in the third embodiment. That is, the step-down value ΔVera decreases monotonically in every erase pulse voltage application (step-down value ΔVera(n)>step-down value ΔVera(n+1)). Moreover, the value by which the step-down value ΔVera decreases is constant, thereby allowing the step-down value ΔVera to be controlled to decrease linearly.

[Advantages]

In the case of adopting the erase operation of the present embodiment, the erase voltage Vera is stepped down in every application of the erase voltage Vera. Hence, the electric field applied to the block insulating film 43C is constant. As a result, an effect due to electrons back-tunneling from the word lines WL1~WL16 (gate electrodes) is reduced, thereby making it possible to improve reliability of operation of the semiconductor memory device. Note that the third embodiment described an operation stepping up the erase voltage Vera and the fourth embodiment described an operation stepping down the erase voltage Vera. During an actual operation the more preferable of these two operations may be adopted according to an effect of deterioration of the tunnel insulating film 43A or an effect of back-tunneling electrons entering the charge storage film 43B via the block insulating film 43C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the embodiments, a step value ΔV (for example, ΔVprog or ΔVera) of an operation voltage was changed linearly in proportion to the number of times of steps n. In an operation of the nonvolatile semiconductor memory device, when a voltage application time t during each operation is constant, the step value of the operation voltage changes linearly in proportion to the voltage application time t. However, the voltage application time t during each operation sometimes extends exponentially each time the number of times of steps n increases (operation time t is proportional to exp(a*n), where a is an arbitrary constant). Since the step value ΔV of the operation voltage is in proportion to the number of times of steps n, the operation time t is in proportion to exp(b*ΔV) (where b is an arbitrary constant). As a result, the step value ΔV of the operation voltage in this case is proportional to a logarithm of the time (operation voltage step value ΔV is proportional to log(t)). Therefore, it is also possible to configure the semiconductor memory device such that the magnitude of the step value ΔV of the operation voltage decreases linearly with respect to logarithm of time.

Note that in the above-described embodiments, it is necessary that there are at least four or more steps in voltage step-up/step-down control of each operation. This is because it cannot be determined whether the decrease in the step-up value or the step-down value is a constant value or not unless there are three or more step-up values or step-down values extracted from at least four pulse voltages.

Moreover, in the above-described embodiments, when the step-up value/step-down value is said to decrease, this is assumed not to include the case where an amount of decrease is zero. Decrease of the step-up value/step-down value in the embodiments is assumed to indicate a decrease value taking a positive value, and the value actually decreasing.

What is claimed is:

1. A nonvolatile semiconductor memory device, comprising:
   a memory cell array having a plurality of electrically rewritable memory transistors arranged therein; and
   a control unit configured to govern control that, in order to erase data of a selected memory transistor, repeats a voltage application operation and a step-down operation, the voltage application operation applying an erase voltage to a body of the selected memory transistor to change a threshold voltage at which the selected memory transistor is conductive, and the step-down operation, in the case where a threshold voltage of the selected memory transistor has not changed to a desired value, decreasing the erase voltage by an amount of a certain step-down value,
   the control unit being configured to control the step-down operation to monotonically decrease the step-down value so as to reduce the value of the erase voltage close to zero as the number of times of the voltage application operations increases.

2. The nonvolatile semiconductor memory device according to claim 1, wherein
   the memory cell array comprises
   a memory string configured having a plurality of electrically rewritable memory transistors connected in series therein, and
   the memory string comprises:
   a first semiconductor layer including a columnar portion extending in a perpendicular direction to a substrate, the first semiconductor layer functioning as a body of the memory transistor;
   a tunnel insulating film formed surrounding a side surface of the columnar portion;
   a charge storage film formed surrounding the tunnel insulating film and configured capable of storing a charge;
   a block insulating film formed surrounding the charge storage film; and
   a first conductive layer formed surrounding the block insulating film and functioning as a gate of the memory transistor.

3. The nonvolatile semiconductor memory device according to claim 1, wherein
   a value by which the step-down value decreases is a constant value.

4. A method of operating a nonvolatile semiconductor memory device, the nonvolatile semiconductor memory device comprising a memory cell array having a plurality of electrically rewritable memory transistors arranged therein and a control unit configured to govern control of an operation to the memory transistor, in order to erase data of a selected memory transistor, the method comprising:

repeating a voltage application operation and a step-down operation, the voltage application operation applying an erase voltage to a selected memory transistor to change a threshold voltage at which the selected memory transistor is conductive, and the step-down operation, in the case where a threshold voltage of the selected memory transistor has not changed to a desired value, decrease the erase voltage by an amount of a certain step-down value; and controlling the step-down operation to monotonically decrease the step-down value so as to reduce the value of the erase voltage close to zero as the number of times of the voltage application operations increases.

\* \* \* \* \*